United States Patent [19]

Yasunaga

[11] 4,081,745
[45] Mar. 28, 1978

[54] DIGITAL-ANALOG INDICATING SYSTEM

[76] Inventor: Soichiro Yasunaga, 2-28, Denenchofu, Ohta, Tokyo, Japan

[21] Appl. No.: 669,517

[22] Filed: Mar. 23, 1976

[30] Foreign Application Priority Data

Dec. 23, 1975 Japan .................................. 50-173176

[51] Int. Cl.² ........................................... G01R 17/06
[52] U.S. Cl. ................. 324/99 R; 324/99 D; 324/100
[58] Field of Search ............... 324/99 D, 99 R, 103 P, 324/111, 100

[56] References Cited

U.S. PATENT DOCUMENTS

| | | | |
|---|---|---|---|
| 1,254,620 | 1/1918 | Newman | 324/111 |
| 2,836,356 | 5/1958 | Forrest et al. | 324/99 D |
| 3,064,193 | 11/1962 | Grubb et al. | 324/99 D |
| 3,267,374 | 8/1966 | McAdam et al. | 324/99 R |
| 3,421,083 | 1/1969 | Bosworth et al. | 324/99 R |
| 3,777,263 | 12/1973 | Perron et al. | 324/103 P |

Primary Examiner—Robert Segal
Assistant Examiner—Ernest F. Karlsen
Attorney, Agent, or Firm—William J. Daniel

[57] ABSTRACT

An unknown voltage to be measured is applied to the input of an automatic servo-actuated potentiometer which when unbalanced by an unknown voltage is servo-actuated to restore a balanced condition with the extent of the displacement necessary for such restoration being indicated on a scale as an analog measure of the input voltage. The absolute value of the voltage across the potentiometer is measured and is supplied to a balance detecting circuit which upon a change in said absolute value actuates a control gate to transmit pulses from a pulse generator to a set of binary counters which have their output signals applied through a binary-decimal converter to a digital display. The counter output signals are also converted to an analog voltage which is fed to the balance detecting circuit and when the converted analog voltage equals the absolute detected voltage, the pulse count is terminated. To indicate input voltages of either polarity, the pulses are fed selectively to the plus or minus input of the binary counters by means of a gating array controlled by means of a comparator which receives the absolute voltage and the converted analog voltage and determines which is the greater for purposes of appropriately actuating the gate array.

7 Claims, 1 Drawing Figure

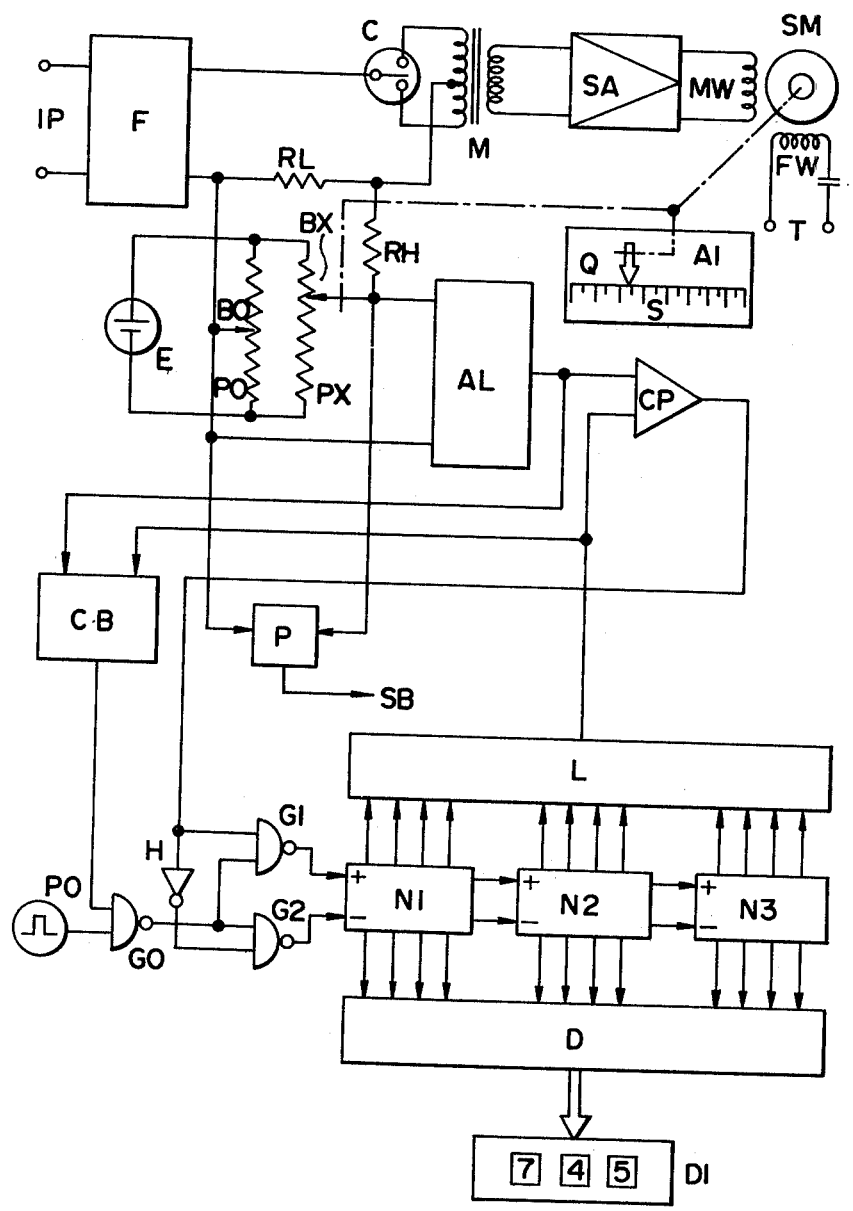

DIGITAL-ANALOG INDICATING SYSTEM

INTRODUCTION

This invention relates to a digital-analog system which provides a simultaneous digital and analog indication of an unknown voltage.

DESCRIPTION OF THE PRIOR ART

It is known in the art to measure an unknown input voltage and to provide both a digital indication and an analog indication representing the magnitude of the input voltage. Conventionally this has been done by applying the input voltage to independently arranged digital and analog measuring systems. Such an arrangement is relatively expensive and suffers from the further disadvantage that the respective analog and digital values may be different from one another instead of corresponding precisely as would be desirable.

STATEMENT OF OBJECT

The present invention has for its object the provision of an improved digital-analog measuring system which operates in stable fashion and insures that the respective analog and digital indications are in precise coincidence.

SUMMARY OF THE INVENTION

In general, the system of the invention utilizes an automatic servo-operated self-balancing potentiometer to which the unknown voltage is applied, the potentiometer having an associated indicator scale for measuring as an analog value the extent of adjustment to restore a balanced condition to the potentiometer. Unbalancing of the potentiometer circuit actuates a control gate for transmitting pulses from a pulse generator to a binary counter array which drives a digital display. The counter signals are converted to an analog voltage and the control gate allows the counting to continue until this analog voltage has equaled the original unbalancing voltage. Where input voltages of either polarity are to be measured, a gate array is actuated to selectively transmit the pulses to be counted to the positive or negative inputs of the binary counters under the control of a comparator which determines the greater of the unbalancing voltage and the converted analog voltage and adjusts the gate array accordingly.

BRIEF DESCRIPTION OF THE DRAWING

The drawing illustrates in schematic fashion one embodiment of a digital-analog measuring system according to the invention.

DETAILED DESCRIPTION OF THE ILLUSTRATIVE EMBODIMENT

Referring to the drawing, an unknown voltage Ex to be measured is applied across the input terminals IP of an automatic servo-operated potentiometer through a filter F to remove background or extraneous noises. The filtered input voltage is applied on one side through a low resistance resistor RL and on the other through a chopper C to the primary of an input transformer M, the chopper C being driven by a conventional ac power source. The secondary side of transformer M is connected to a servo-amplifier SA which has its output applied to the motor winding MW of the servo-motor SM. The field winding FW of the servo-motor is connected to a conventional ac source through the terminals T.

The potentiometer circuit includes a reference voltage source E connected in parallel to the resistance PO and PX. The side of the input voltage applied to the resistance RL is also applied to the slider BO which may be manually adjustable for purposes of calibration but is fixed during operation. The servo-motor SM is mechanically coupled to the slider BX so as to displace slider BX along the resistance PX as necessary to restore the potentiometer to a balanced or null condition. A movable indicator Q with an associated fixed scale S is also mechanically coupled to servo-motor SM, and the final position of indicator Q relative to the scale gives an analog indication (AI) of the unknown input voltage.

The movable slider BX is connected through a high resistance resistor RH to the side of low resistance RL away from the input so that the potentiometer slides are connected across resistances RL and RH. If the values of resistors RL and RH are represented by $R_l$ and $R_h$, respectively, and the voltage existing between the fixed or reference slider BO and the adjustable slider BX is represented by $E_p$, a balancing voltage $E_b$ is applied by the potentiometer across the resistor RL of a magnitude given by the equation.

$$E_b = \frac{R_l \times E_p}{R_l + R_h} \tag{I}$$

The input transformer M of the servo-amplifier therefor receives a voltage which is proportional to the sum of the balance $b$ voltage $E_b$ plus the unknown input voltage $E_x$. The servo-motor will rotate in the appropriate direction according to the sign of this composite voltage to displace the movable slider BX in a direction to restore an equilibrium or balanced condition.

When the potentiometer has reached equilibrium, $$E_x + E_b = 0 \tag{IIa}$$
$$\text{or}$$
$$E_b = -E_x \tag{IIb}$$

Substituting for $E_b$ from equation I above, $$\frac{R_l \times E_p}{(R_l + R_h)} = -E_x \tag{IIIa}$$

and solving for $E_p$, $$E_p = -\frac{(R_l + R_h)}{R_l} E_x \tag{IIIb}$$
$$\text{or}$$
$$E_p = -(\frac{R_h}{R_l} + 1) E_x \tag{IIIc}$$

If the magnitude of the resistance RH is selected to be sufficiently larger than that of RL, an approximation for $E_p$ is given by the following equation $$E_p = -\frac{R_h}{R_l} E_x \tag{IV}$$

Thus, if the magnitude of resistance RH is, for example, 1,000 times that of RL, the effect of applying a voltage of several volts to the slider BX is achieved by an unknown input voltage in the order of several millivolts.

The potential difference existing across the sliders BO and BX is measured in the form of an absolute value, that is, independently of the polarity of such potential, by an absolute voltage detecting circuit AL and appears as a positive voltage at the output of circuit AL. Any change in this absolute voltage output is utilized to trigger, via a balancing detecting circuit CB, the counting of pulses by a set of binary counters N1, N2, N3, etc. The pulses are generated by a clock pulse generator PO, the output of which is applied to a control AND gate $G_0$ having its output applied to the input of the binary counter via a polarity control circuit to be described later. Output signals from the binary counters N1–N3 are converted by a binary-decimal converter D to a digital value which is supplied to a digital display DI. Output signals from the binary counters N1–N3 are also converted into a corresponding analog voltage ($E_a$) by the digital-to-analog converter L and the thus generated analog voltage $E_a$ is fed to the balance detecting circuit CB.

As long as the absolute voltage value is in equilibrium with the analog voltage $E_a$, the balance detecting circuit feeds a signal "0" to the AND gate $G_0$; whereas when these voltages are unequal, the balance detecting circuit supplies the signal "1" to AND gate $G_0$. Thus, AND gate $G_0$ transmits pulses only when balance detecting circuit CB detects a change between the absolute output value of circuit AL and the generated analog voltage $E_a$ and allows such count to continue until a balanced condition between these voltages is restored. The binary counters, therefore, count for a period of time which corresponds to the time required for the potentiometer to be restored to a balanced condition by displacement of adjustable slide BX which is driven at a constant rate by the servo-motor SM. The number of pulses counted during this time will, therefore, give an indication of the magnitude of the unknown input voltage which is displayed in digital form at the same time an analog indication is given by pointer Q on scale S.

The generated analog voltage $E_a$ constitutes in effect a feedback from the binary counters which is used to control the pulse counting circuit and thus assure an accuracy in the measured count by such circuit.

Since the unknown input voltage $E_x$ may be positive or negative, provision is preferably made for measuring voltages of either polarity. To this end, the flow of pulses passed by the AND gate $G_0$ is selectively controlled by a polarity control circuit interposed between gate $G_0$ and the binary counters N1-3. This circuit consists of two AND gates $G_1$ and $G_2$ connected on one side in parallel to the output of the control AND gate $G_0$ and on the other side to the opposite sides of an inverter H which is connected to the output of a comparator CP. Comparator CP receives as inputs the absolute measured voltage from the absolute voltage detecting circuit AL and the generated analog voltage $E_a$ from the digital analog converter L. When the absolute measured voltage exceeds the regenerated analog voltage, comparator CP gives an output pulse "1" while when the analog voltage exceeds the measured voltage, the comparator output is "0". When the comparator output voltage is "1", it is applied to the input of gate $G_1$ and when a pulse "1" is transmitted by the control gate $G_0$ as a signal "1", gate $G_1$ gives an output pulse which is applied to the plus input of the binary counter array to increase the count. The "1" output is inverted by inverter H and is consequently transmitted as "0" to the other gate $G_2$ so that when gate $G_2$ receives a "1" pulse from the pulse generator, it remains closed and the negative input of the counters is unaffected.

On the other hand, when the comparator gives an "0" output, this output is received by the gate $G_1$ which when the clock pulse "1" is also received remains closed. The "0" output pulse is inverted by the inverter H and is, therefore, applied to the other gate $G_2$ as a "1" signal which when gated with a "1" pulse from the pulse generator results in the transmission of a pulse thereby which is applied to the negative side of the binary counter array. It will, therefore, be understood that when the absolute measured value exceeds the generated analog value, the pulses will increase the binary count; whereas when the absolute measured value is less than the generated analog value, the pulses will be subtracted from the binary counter with corresponding changes in the digital display.

The potentiometer slides BO and BX are also connected to a polarity-identifying circuit P which ascertains whether the input voltage to the potentiometer is positive or negative and furnishes an appropriate output indication to the terminal SB. Although not depicted in the drawings, terminal SB could be connected to the digital display to actuate a positive or negative display indication under appropriate circumstances or if operational use is made of the digital count employed as might be required in that connection.

Obviously, the unknown input voltage can be derived from any sensing element adapted to give a voltage change as a function of a measured variable. Such elements can include thermocouples, pH amplifiers, gas analyzers, radiation gages, photoelectric cells, smoke-density cells, converters and the like. Accordingly, the digital indication can be used for operational purposes, being applied e.g. to a control computer, or can be applied to a printer for recordation. Similarly, a recording pen can be coupled to the servo-motor SM for automatically recording the analog indication.

The arrangement of differential resistances RH, RL in effect serves to amplify small unknown input voltages for purposes of the digital measurement so that no operational amplifier is needed for this purpose and thus high stability is possible.

What is claimed is:

1. A method of producing corresponding digital and analog indications of an unknown input voltage comprising the steps of applying the unknown voltage across an initially balanced potentiometer including an adjustable slider, adjusting the position of such slider to restore the potentiometer to a balanced condition while quantitatively indicating the magnitude of such adjustment to thus provide an analog indication of the unknown voltage corresponding to the extent of such adjustment, measuring the absolute value of the potential existing across the potentiometer, initiating a flow of pulses to a pulse counter in response to a change in the absolute measured voltage, driving a digital display in response to the pulse counter, generating an analog voltage corresponding to the count in the pulse counter, comparing the absolute measured voltage and the generated analog voltage and terminating the pulse count when the absolute measured voltage and the generated analog voltage are in equilibrium.

2. The method of claim 1 wherein unknown voltages of either polarity are indicated and including the steps of comparing the absolute measured voltage and the generated analog voltage to determine which is greater and selectively controlling the flow of pulses to the counter to increase or decrease the counted value in response to such comparison.

3. The method of claim 1, wherein said voltage is applied to said potentiometer through a combination of relatively low and relatively high electrical resistances whereby said absolute measured voltage is greater than said unknown voltage by a factor substantially equal to the ratio of said resistances.

4. A dual analog-digital indicating system comprising an automatic, servo-operated, self-balancing potentiometer, means for applying an unknown voltage to said potentiometer to unbalance the same and adjust said potentiometer to produce therein a balancing voltage proportional to said unknown voltage, analog indicating means driven in correspondence with the adjustment of said potentiometer to give an analog indication of the magnitude of said balancing voltage, means for measuring said balancing voltage and giving an output voltage equal thereto, analog-to-digital converting means receiving said measured output voltage and giving a digital indication thereof, a digital-to-analog converter for converting said digital indication to an analog voltage, and means for comparing said measured and analog voltages and terminating said analog-to-digital conversion when said measured and analog voltages are in equilibrium.

5. A dual indicating system as in claim 4 for indicating voltages of either polarity and including means for determining the greater of said measured voltage and said analog voltage and increasing or decreasing the digital indication given by said analog-to-digital converting means according to said determination.

6. A dual indicating system as in claim 4 wherein said unknown voltage is applied to said potentiometer through a differential electrical resistance in order that the balancing voltage across the potentiometer is greater than said unknown voltage by a factor equal to the ratio of the differential resistance whereby small unknown voltages can be measured and converted without amplification.

7. A dual indicating system as in claim 4 wherein said potentiometer includes an adjustable slider which is adjusted in position in response to the application to the potentiometer of an unknown voltage to restore the potentiometer to a balanced condition and said analog indicating means is mechanically coupled to said adjustable slider so as to move in accordance with the movement of the slider and thus quantitatively indicate the position of said slider.

* * * * *